(12) United States Patent
DiLullo et al.

(10) Patent No.: US 8,122,410 B2
(45) Date of Patent: Feb. 21, 2012

(54) SPECIFYING AND VALIDATING UNTIMED NETS

(75) Inventors: Jack DiLullo, Austin, TX (US); Ronald Nick Kalla, Round Rock, TX (US); Gavin Balfour Meil, Round Rock, TX (US); Jeffrey Mark Ritzinger, Chippewa Falls, WI (US)

(73) Assignee: International Business Machines Corporation, Armonk, NY (US)

( * ) Notice: Subject to any disclaimer, the term of this patent is extended or adjusted under 35 U.S.C. 154(b) by 586 days.

(21) Appl. No.: 12/264,992

(22) Filed: Nov. 5, 2008

(65) Prior Publication Data
US 2010/0115482 A1 May 6, 2010

(51) Int. Cl.
G06F 9/455 (2006.01)
G06F 17/50 (2006.01)

(52) U.S. Cl. ......... 716/113; 716/107; 716/108; 716/134

(58) Field of Classification Search .................. 716/107, 716/108, 113, 134
See application file for complete search history.

(56) References Cited

U.S. PATENT DOCUMENTS

| | | | |
|---|---|---|---|
| 4,011,465 A | 3/1977 | Alvarez, Jr. | |
| 5,287,289 A | 2/1994 | Kageyama et al. | |
| 5,396,435 A | 3/1995 | Ginetti | |
| 5,452,239 A | 9/1995 | Dai et al. | |
| 5,499,192 A | 3/1996 | Knapp et al. | |
| 5,504,690 A | 4/1996 | Kageyama et al. | |
| 5,586,047 A | 12/1996 | Imahashi | |
| 5,659,484 A | 8/1997 | Bennett et al. | |
| 5,828,860 A | 10/1998 | Miyaoku et al. | |
| 5,958,077 A | 9/1999 | Banerjee et al. | |
| 5,966,523 A | 10/1999 | Uchino | |
| 6,056,784 A | 5/2000 | Stanion | |
| 6,071,003 A | 6/2000 | Ashuri et al. | |
| 6,216,219 B1 | 4/2001 | Cai et al. | |
| 6,321,184 B1 | 11/2001 | Baumgartner et al. | |
| 6,374,393 B1 | 4/2002 | Hirairi | |
| 6,487,705 B1 * | 11/2002 | Roethig et al. ................ 716/104 |
| 6,516,449 B2 | 2/2003 | Masud | |
| 6,553,514 B1 | 4/2003 | Baumgartner et al. | |

(Continued)

FOREIGN PATENT DOCUMENTS
JP 11085839 A 3/1999
(Continued)

OTHER PUBLICATIONS

Embanath et al; "Exceptional ASIC: Through Automatic Timing Exception Generation (ATEG)"; 2006; Conexant Systems India Ltd.; pp. 1-4.*

(Continued)

Primary Examiner — Suresh Memula
(74) Attorney, Agent, or Firm — Frances Lammes; Stephen J. Walder, Jr.; Diana R. Gerhardt

(57) ABSTRACT

In accordance with an aspect of the present invention, specifying a portion of a circuit design to be treated as untimed by static timing analysis is performed on the RTL design by means of an attribute annotation. The process is operable to map through to the Physical Design by correlating latches and chip-level nets. This allows the testing process to become closed-loop. Design and simulation time is also greatly reduced due to the accessibility of RTL design.

15 Claims, 4 Drawing Sheets

U.S. PATENT DOCUMENTS

| | | | |
|---|---|---|---|
| 6,587,993 | B2 | 7/2003 | Shoyama |
| 6,643,829 | B1 | 11/2003 | Borkovic et al. |
| 6,643,832 | B1 | 11/2003 | Ray et al. |
| 6,816,825 | B1 | 11/2004 | Ashar et al. |
| 6,868,535 | B1 | 3/2005 | Podkolzin et al. |
| 6,959,271 | B1 | 10/2005 | Ballam |
| 6,973,632 | B1 | 12/2005 | Brahme et al. |
| 7,020,589 | B1 | 3/2006 | Datta Ray et al. |
| 7,086,016 | B2 | 8/2006 | Matsuzaki et al. |
| 7,194,715 | B2 | 3/2007 | Charlebois et al. |
| 7,216,318 | B1* | 5/2007 | Siarkowski ............ 716/104 |
| 7,240,311 | B2 | 7/2007 | Lai et al. |
| 7,257,524 | B2 | 8/2007 | Schilp et al. |
| 7,302,659 | B2 | 11/2007 | Ja et al. |
| 7,340,698 | B1 | 3/2008 | Srinivasan et al. |
| 7,447,620 | B2 | 11/2008 | Hidvegi et al. |
| 7,490,305 | B2 | 2/2009 | Gass et al. |
| 7,743,352 | B2* | 6/2010 | Ganai et al. ............ 716/106 |
| 7,885,801 | B2 | 2/2011 | Hidvegi et al. |
| 7,886,244 | B2 | 2/2011 | Gass et al. |
| 2001/0020289 | A1 | 9/2001 | Pavisic et al. |
| 2003/0023941 | A1 | 1/2003 | Wang et al. |
| 2003/0061470 | A1 | 3/2003 | Yeh |
| 2004/0103387 | A1 | 5/2004 | Teig et al. |
| 2004/0225977 | A1 | 11/2004 | Akkerman |
| 2004/0233742 | A1 | 11/2004 | Morzano |
| 2004/0250226 | A1 | 12/2004 | Lin et al. |
| 2005/0246673 | A1 | 11/2005 | Charlebois et al. |
| 2005/0273748 | A1 | 12/2005 | Hetzel et al. |
| 2006/0052994 | A1* | 3/2006 | Takei ..................... 703/14 |
| 2006/0095879 | A1 | 5/2006 | Brahme et al. |
| 2006/0190860 | A1 | 8/2006 | Ng et al. |
| 2006/0190883 | A1 | 8/2006 | Ja et al. |
| 2006/0239392 | A1 | 10/2006 | Cummings et al. |
| 2007/0011527 | A1* | 1/2007 | Goswami et al. ......... 714/726 |
| 2007/0033551 | A1 | 2/2007 | Greaves et al. |
| 2007/0198238 | A1 | 8/2007 | Hidvegi et al. |
| 2008/0016480 | A1* | 1/2008 | Gass et al. ............. 716/6 |
| 2008/0141184 | A1* | 6/2008 | Dirks et al. ............ 716/2 |
| 2008/0201671 | A1* | 8/2008 | Rejouan et al. ......... 716/6 |
| 2008/0209377 | A1* | 8/2008 | Kondo ................... 716/6 |
| 2009/0070619 | A1* | 3/2009 | Gotoh ................... 713/500 |
| 2009/0144690 | A1* | 6/2009 | Spackman et al. ........ 716/18 |
| 2009/0150136 | A1* | 6/2009 | Yang .................... 703/13 |
| 2010/0064263 | A1* | 3/2010 | Rahim et al. ........... 716/2 |

FOREIGN PATENT DOCUMENTS

JP 2006127380 A 5/2006

OTHER PUBLICATIONS

Cornet et al.; "A Method for the Efficient Development of Timed and Untimed Transaction-Level Models of Systems-on-Chip"; Apr. 2008; STMicroelectronics, Systems Platforms Group; pp. 1-6.*
USPTO U.S. Appl. No. 11/054,903; 2 pages.
USPTO U.S. Appl. No. 11/360,906; 2 pages.
USPTO U.S. Appl. No. 11/457,865; 2 pages.
USPTO U.S. Appl. No. 12/168,888; 2 pages.
USPTO U.S. Appl. No. 12/271,588; 3 pages.
Conte, Gianni et al., "Generalized Stochastic Petri Nets and Their Use in Modeling Distributed Architectures,", IEEE, Invited Paper, 1991, pp. 296-303.
Gharaybeh, Marwan A. et al., "False-Path Removal Using Delay Fault Simulation", Proceedings of Seventh Asian Test Symposium, Dec. 2-4, 1998, pp. 82-87.
Jensen, Kurt, "An Introduction to the Practical Use of Coloured Petri Nets", Lecture Notes in Computer Science: Lectures on Petri Nets II: Applications, vol. 1492, 1998, 56 pages.
Mallet, F. et al., "From UML to Petri Nets for non functional Property Verification", International Symposium on Industrial Embedded Systems (IES'06), Oct. 2006, 9 pages.
Miyamoto, Toshiyuki et al., "An Efficient Algorithm for Deriving Logic Functions of Asynchronous Circuits", Proceedings of Second International Symposium on Advanced Research in Asynchronous Circuits and Systems, Mar. 18-21, 1996, pp. 30-35.
Xie, X. et al., "Design of Robust-Path-Delay-Fault-Testable Combinational Circuits by Boolean Space Expansion", IEEE, 1992 International Conference on Computer Design: VLSI in Computers and Processors (ICCD '92), Oct. 11-14, 1992, pp. 482-485.
Korean Office Action, including English Translation, cited in Korean Application No. 10-2009-0085780, dated Feb. 21, 2011, 5 pages.

* cited by examiner

SPECIFYING AND VALIDATING UNTIMED NETS

This invention was made with United States Government support under Agreement No. HR0011-07-9-002 awarded by DARPA. The Government has certain rights in the invention.

BACKGROUND

Integrated circuits may typically be designed using two basic design stages. The first design stage, known as the Register Transfer Level (RTL), describes the behavior of a circuit in terms of logical functions using registers and combinational logic, e.g., logic gates. The RTL may be verified against a higher level specification, such as for example, an instruction architecture. The verification of the RTL entails simulation and other means to ensure that the RTL design performs its intended functions. The second design stage is the Physical Design (PD). This stage represents the same circuit design in what will be its actual layout using physical components, e.g., transistors. The PD is conventionally tested in two separate ways. The first test uses Static Timing Analysis (STA) to verify that the PD of the circuit can correctly operate at a target frequency. The second test is a Boolean equivalence test between the RTL and the PD. It should be noted that a verification of the RTL is independent of the PD, whereas the Boolean equivalence test relies on both the RTL and the PD. Certain parts of a circuit may not be required to operate at the target frequency for a variety of reasons, and thus may be bypassed during STA and may be considered "untimed." These untimed sections may typically be manually denoted in the PD for the STA to recognize. Manually denoting untimed sections of a circuit is tedious and may not directly translate to the RTL from the PD. As such the conventional method of denoting untimed sections of a circuit in the PD is not versatile in the event of a circuit redesign.

FIG. 1 illustrates an example circuit design system 100, which includes an RTL 102 and a PD 104. Once a circuit is designed in RTL 102, the circuit design then undergoes a synthesis 106 to produce PD 104. Of course synthesis is not required. In some example circuit design systems, a PD may be custom designed.

More specifically, RTL 102 contains the functional design of the circuit. The synthesis process 106 refines this design into PD 104, thereby maximizing some aspect of the circuit's performance or design; i.e. speed, or type of components. PD 104 still performs the expected function, within its respective embodiment. The internal design of PD 104 however, does not necessarily mirror RTL 102. This will be described in more detail with reference to FIG. 2.

FIG. 2 illustrates a block diagram example of a design process 200, which includes an RTL 202 and a PD 204. RTL 202 contains a circuit 208, which includes macros 210, 212, and 214 connected by net 222. A macro is a block of circuit components that can be designed independently of other macros and iterated. Circuit 208 has one input 216 and two outputs 218 and 220. PD 204 is synthesized from RTL 202 via synthesis process 106. PD 204 contains circuit 224, which corresponds to circuit 208 of RTL 202. Circuit 224 includes three macros 226, 228, and 230 connected by net 223, which correspond to macros 210, 212, and 214 connected by net 222, respectively. Circuit 224 has one input 225 and two outputs 229 and 231. Circuit 208 inputs example test values 232 and outputs values 234. Likewise, circuit 224 inputs example signals 236 and outputs signals 238.

In operation, circuit 208 in the RTL 202 should input test value stream 232 on input pin 216 and output the value streams in output 234 on output pins 218 and 220. After synthesis 106, PD 204 will contain circuit 224 that will input the test signal stream 236 on pin 225 and output the signal streams in output 238 on pins 229 and 231.

Using a Boolean verification test, the input tests 232 and 236 should match in value within their respective embodiments. Likewise, output tests 234 and 238 should also match in value, respectively. The existence of a discrepancy in either input values or output values between RTL 202 and PD 204 might indicate a design flaw or process flaw.

While macros 210, 212 and 214 may correspond to macros 226, 228 and 230, respectively, macros 210, 212 and 214 are internally different from macros 226, 228 and 230, respectively, due to the synthesis process 106. This is because synthesis 106 changes the design of circuit 224 based on a desired performance/design aspect while maintaining its overall input/output function. Therefore, Boolean verification only checks for the equivalence of input and output values of both layers.

FIG. 3 illustrates a more detailed example of a circuit design within a RTL. In the figure, circuit 300 has three macros 302, 304 and 306. Each macro is designed to perform a specific function. In this example, each macro consists of combinational logic and latches designed to manipulate signals according to a desired function.

Macro 302 includes AND gate 316, AND gate 318, OR gate 320 and a latch 322. Macro 302 has four inputs 308, 310, 312 and 314. Inputs 308 and 310 feed AND gate 316, whereas inputs 312 and 314 feed AND gate 318. The output of AND gate 316 and the output of AND gate 318 feed OR gate 320. The output of OR gate 320 feeds the input of latch 322. The output of latch 322 is the output of Macro 302.

Macro 304 includes AND gate 326 and a latch 328. Macro 304 has a first input from a net 323 and a second input 325. First input from node 323 and second input 325 feed AND gate 326. The output of AND gate 326 feeds the input of latch 328. The output of latch 328 is the output 329 of Macro 304.

Macro 306 includes AND gate 332 and a latch 330. Macro 306 has a first input from a net 323 and a second input 334. First input from node 323 and second input 334 feed AND gate 332. The output of AND gate 332 feeds the input of latch 330. The output of latch 330 is the output 336 of Macro 306.

In operation, input signals are provided to inputs 308, 310, 312 and 314 of macro 302. The signals are passed through combinational logic of gates 316, 318 and 320. A resulting signal is provided to net 321. A clock signal from clock 324 enables latch 322 to sample the data on net 321 and to output the data to net 323. The clock signal from clock 324 may enable a latch by any known method, non-limiting examples of which include on the rising edge of a clock signal pulse, on the falling edge of a clock signal pulse, etc.

From net 323, the data is then passed to macro 304 and macro 306. The logic of macro 304 is output at output 329, whereas the logic of macro 306 is output at output 336. The data at each of output 329 and output 336 is known as the "state" of the latches therein, and may be changed on each clock pulse from of clock 324.

Boolean verification may be performed on the output data for each macro or even on the inputs for each individual latch within each macro. As such, there should be latch correspondence between the RTL and PD. At the RTL, each macro, each latch and each gate is presumed to transmit data ideally in each clock cycle. Therefore, time delay based on specific physical parameters is not considered. Because the circuitry in RTL is designed without consideration given to the time delays inherent in the electronic components, STA is not performed on the RTL.

FIG. 4 illustrates a more detailed example of a circuit design within a PD that has been synthesized from RTL in FIG. 3, wherein the synthesis was set to produce a circuit that used only NAND gates and inverters. In FIG. 4, circuit 400 has three macros 402, 404 and 406.

Macro 402 includes NAND gate 420, NAND gate 418, NAND gate 422 and a latch 424. Macro 402 has four inputs 408, 410, 412 and 414. Inputs 408 and 410 feed NAND gate 420, whereas inputs 412 and 414 feed NAND gate 418. The output of NAND gate 420 and the output of NAND gate 418 feed NAND gate 422. The output of NAND gate 422 feeds the input of latch 424. The output of latch 424 is the output of Macro 402.

Macro 404 includes NAND gate 428, NOT gate 430 and a latch 432. Macro 404 has a first input from a net 423 and a second input 426. First input from node 423 and second input 426 feed NAND gate 428. The output of NAND gate 428 feeds the input of NOT gate 430. The output of NOT gate 430 feeds the input of latch 432. The output of latch 432 is the output 434 of Macro 404.

Macro 406 includes NAND gate 438, NOT gate 440 and a latch 442. Macro 406 has a first input from a net 423 and a second input 444. First input from node 423 and second input 444 feed NAND gate 438. The output of NAND gate 438 feeds the input of NOT gate 440. The output of NOT gate 440 feeds the input of latch 442. The output of latch 442 is the output 446 of Macro 406.

In some instances, the PD might include actual physical components as exemplified in circuit 403, which corresponds to NAND gate 418. In this example, circuit 403 includes a resistor 448, a transistor 450, a transistor 452, a resistor 454 and a resistor 456. For the sake of simplicity, circuit 400 is illustrated with a lower level logic symbol for each component.

In operation, input signals are provided to inputs 408, 410, 412 and 414 of macro 402. The signals are passed through combinational logic of gates 420, 418 and 422. A resulting signal is provided to latch 424. A clock signal from clock 436 enables latch 424 to sample the data from gate 422 and to output the data to net 423. The clock signal from clock 436 may enable a latch by any known method, non-limiting examples of which include on the rising edge of a clock signal pulse, on the falling edge of a clock signal pulse, etc.

From net 423, the data is then passed to macro 404 and macro 406. The logic of macro 404 is output at output 434, whereas the logic of macro 406 is output at output 446. The data at each of output 434 and output 446 is known as the "state" of the latches therein, and may be changed on each clock pulse of clock 436.

In operation, PD circuit 400 would operate much like RTL circuit 300. However, note that the internals of the macros are different due to synthesis. For example, macro 402 consists of a combinational logic of two NAND gates 420 and 418 that are fed into NAND gate 422 to create a circuit of NAND gates that is identical in logical function to the combinational circuit of macro 302 in FIG. 3.

Since the components in a PD are physical, inherent delays are present and must be considered in the design. If each NAND gate has a delay of X picoseconds, each latch has a total delay of 2X picoseconds, and each inverter with a delay of X/2 picoseconds; then the longest path a signal would take would be from latch 424 through NAND gate 428, inverter 430 and to latch 432. Therefore the clock period of CLK 436 must be larger than 2X+X+X/2+2X for a signal to be properly sampled into the latch 432. In addition to a signal's total path delay being a concern in circuit design, the separate set-up and hold requirements inherent in every latch must be considered. So a STA on each latch is required to verify that all sequential storage elements of the circuit operate within the target clock frequency.

FIG. 5 illustrates a wave diagram of set-up and hold times inherent in a latch. In the figure, clock signal 502 sends out a pulse train having a period 504. Included in clock signal 502 are a rising edge 506 and falling edge 508. A DATA signal 510 includes a valid data portion 512, which is transmitted over a period 514. Included in period 514 is a set-up period 516 and a hold period 518.

In operation, a clock signal 502 will pulse with period 504. Rising edge 506 will trigger a sample action of DATA signal 510 into a latch. The data input into the latch must be valid data portion 512 before rising edge 506 arrives at the latch in order for the data to be properly sampled into the latch. This is known as the "set-up" time or set-up period 516. The data must also still be valid for hold period 518, which is the period after the rising edge 506 has arrived. Set-up period 516 and hold period 518 combine for a total time of period 514 that the data must be valid for proper sampling into a latch.

During STA, an STA tool performs a set-up and hold test on each latch. A set up and hold test is a comparison of arrival times of clock and data on the latch input pins. The STA applies a "phase tag" to each clock signal, which it propagates to each clock input of each latch. The phase tag is a marker of which clock is clocking the latch. The STA also applies a phase tag to the output of each latch, based on which phase tag was propagated to the latch's clock input. Such a phase tag is a marker of which edge of which clock is responsible for launching a transition from the output of the latch. The STA tool propagates the phase tag through each net in the path from the latch output to each other latch's input, keeping track of arrival times at each point relative to the phase tag. If the difference is outside the time constraints of a target clock period, then a circuit redesign is possibly needed.

It is sometimes desirable for the STA to ignore certain sections of a circuit for various reasons. For example, if macro 404 in FIG. 4 is used only for test purposes, then it would not need to follow the constraints of normal operation. Therefore, its timing would not matter. In this situation its phase tag at net 431 might be renamed to be "don't-care." In some cases, this is performed through a control file known as a "DCADJ" or "don't-care and adjust" file. This effectively makes the circuit of net 431 an "untimed" circuit, thus preventing STA from testing propagations through the specified circuit.

There are problems with the use of the DCADJ file however. It is a specification of the untimed nets in a circuit; but it is essentially a human-written text file, making it tedious to create and maintain. Because it generally uses regular expressions to specify named nets to be untimed nets, the regular expressions may over specify nets. Also, any change to the design requires a rewrite of the DCADJ file as well. Because the nets do not necessarily correspond to the RTL design, it is also manual and tedious to locate the corresponding nets for change. Because the DCADJ file only specifies nets on the PD, there is no mapping of the corresponding nets between both the PD and RTL. This allows the check to become an "open-loop" process where, an error on either side may go undetected until the manufacture of the unit.

What is needed is a method of specifying untimed nets on both the RTL and PD of a system allowing for the automation of verification of the RTL and phase renaming in the STA of the PD.

SUMMARY

An aspect in accordance with the present invention specifies timing attributes of signals by method of annotation in the RTL that map into attributes of corresponding signals in the PD.

An example embodiment in accordance with the present invention is drawn to a method of modeling an integrated circuit design. The method includes creating a RTL design of the integrated circuit, wherein the RTL design including an untimed net. The method further includes associating a timing parameter to the untimed net.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

DESCRIPTION OF THE SEVERAL VIEWS OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

In accordance with an aspect of the present invention, untimed nets are determined in the RTL to properly account for untimed nets in the verification of the RTL. One manner of verification of the RTL includes driving indeterminate values on untimed nets during simulation of the RTL. In some example embodiments, certain parts of a circuit in the RTL are annotated with a timing parameter, which is carried through to the PD. In some example embodiments, untimed nets within the RTL are annotated with an "untimed" parameter, which is carried through to the PD. Accordingly, all untimed nets developed in the PD, which originated from untimed nets in the RTL, will always have correct untimed annotations, even when modifications in the PD occur.

Example methods of designing an integrated circuit in accordance with an aspect of the present invention will now be described with reference to FIGS. 1-6.

Figure 6:
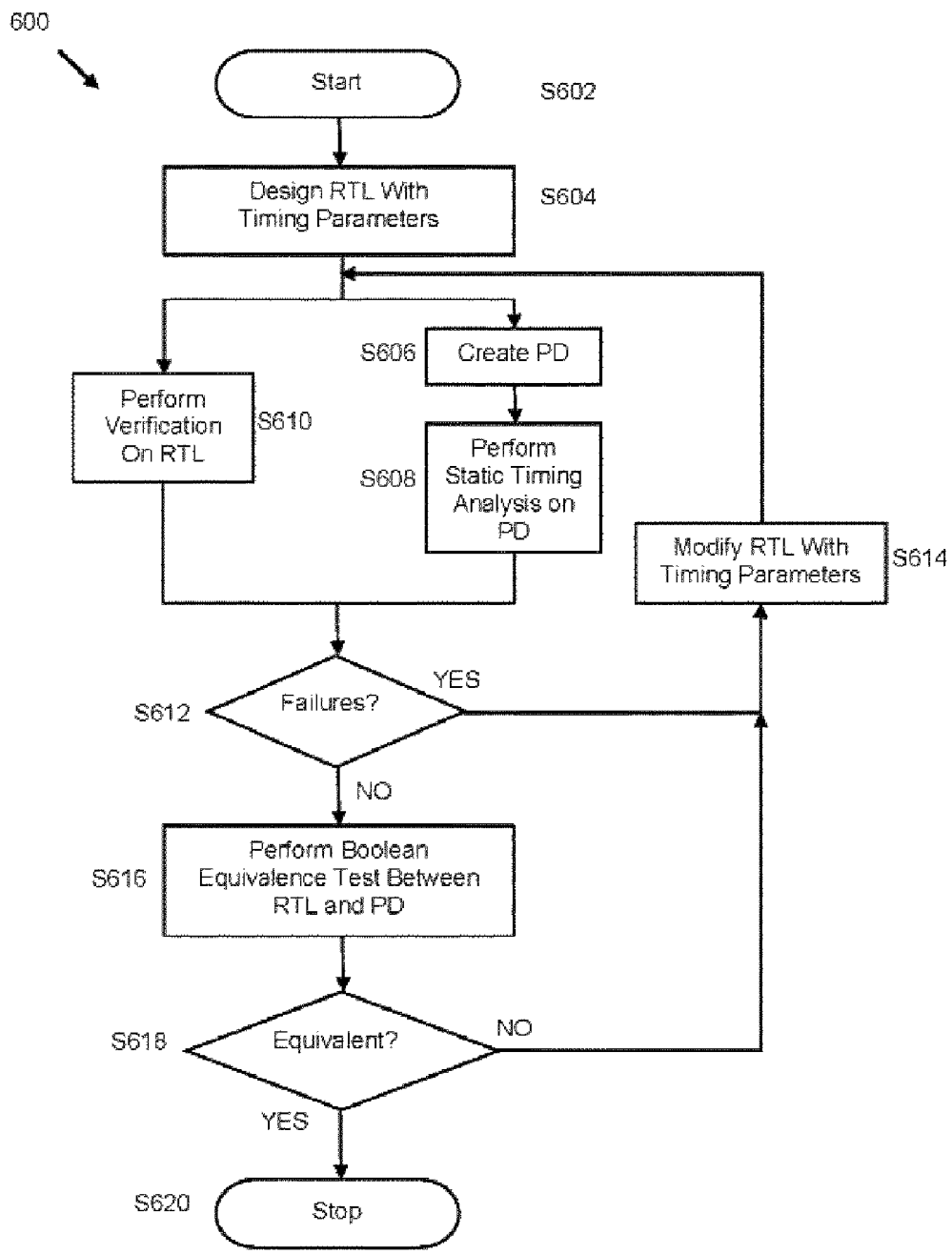
FIG. 6 is a flowchart illustrating an example process of designing an integrated circuit in accordance with an aspect of the present invention.

FIG. 6 is a flowchart illustrating an example process 600 of designing an integrated circuit in accordance with an aspect of the present invention.

Figure 1:
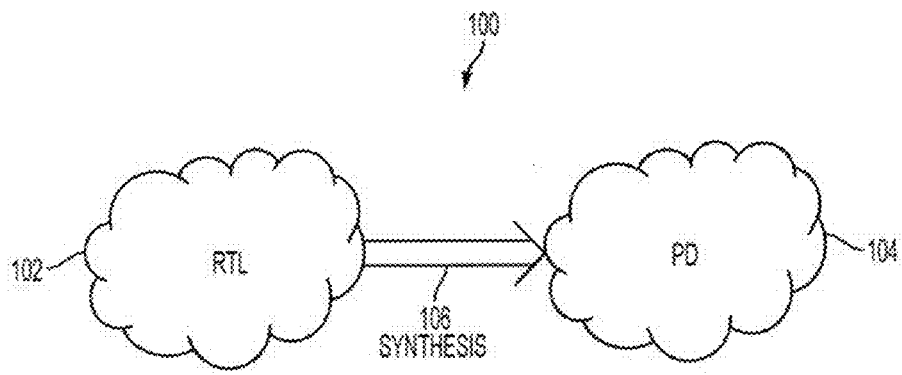
FIG. 1 illustrates a circuit design system.

After process 600 starts (S602), the RTL of the integrated circuit is designed. Using the design process as illustrated in FIG. 1, a timing parameter may be associated with any untimed nets within RTL 102 (S604). After RTL 102 is created, a synthesis process 106 generates PD 104 (S606). At this point STA is then performed on PD 104 (S608). Further, a verification process may be performed on RTL 102 (S610). It is then determined whether there are any failures in the STA on PD 104 or whether there are any failures in the verification of RTL 102 (S612). If there are any failures, then the RTL 102 is modified (S614) and the designing continues. If there are no failures, a Boolean equivalence test is performed between RTL 102 and PD 104 (S616). It is then determined whether there is Boolean equivalence between PD 104 and RTL 102 based the outcome of the Boolean equivalence test (S618). If there is Boolean equivalence between PD 104 and RTL 102, then the process stops (S620) and the circuit design is functionally acceptable. If there is not Boolean equivalence between PD 104 and RTL 102, then the RTL 102 is modified (S614) and the designing continues.

The timing parameter that is associated with untimed nets within RTL 102 will carry through synthesis process 106 to PD 104. Nets in PD 104 that correspond to untimed nets within RTL 102 are untimed nets. Accordingly, any untimed nets developed in PD 104 that originated from untimed nets in RTL 102 will always have the correct untimed annotations associated therewith. RTL 102 and PD 104 may be developed by any method, i.e., drafted on paper, coded in a hardware description language (HDL) program, etc. Whatever the development method, an aspect in accordance with the present invention may be applied, e.g., adding a timing parameter to untimed nets in the RTL, which will carry through synthesis and into the PD.

Figure 2:
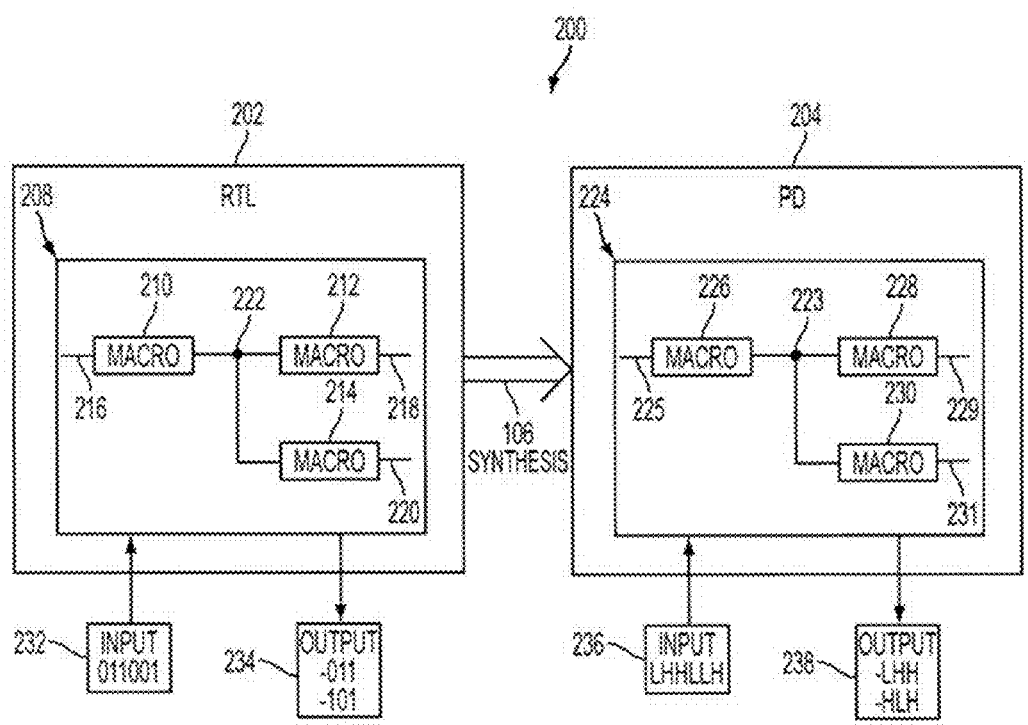
FIG. 2 illustrates a block diagram example of a design process.
Figure 3:
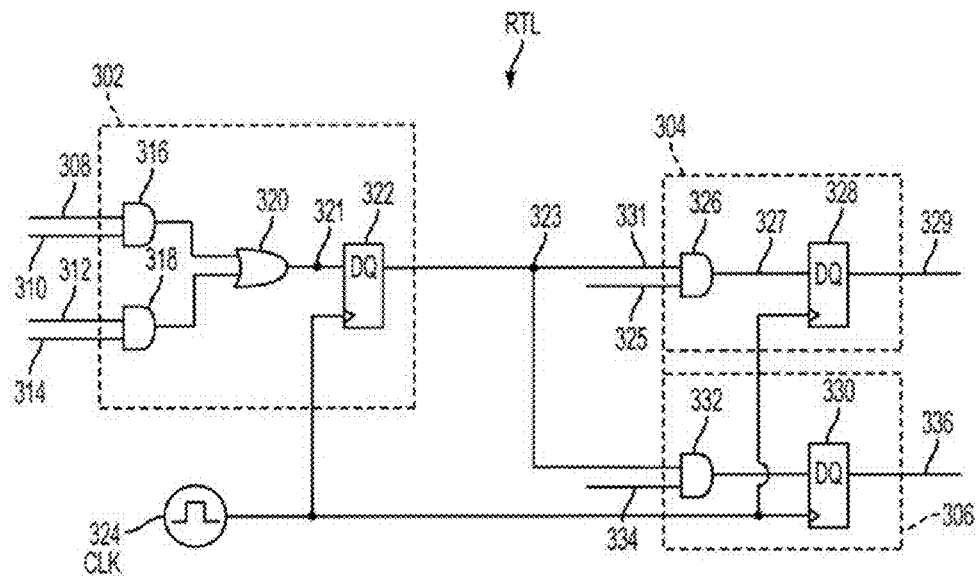
FIG. 3 illustrates a more detailed example of a circuit design within a RTL.

In the more detailed illustration of FIG. 2, take the example that net 222 of RTL 202 is untimed. Net 222 would then be attributed with a timing parameter with an untimed value in RTL 202. After RTL 202 undergoes synthesis process 106 to create PD 204, corresponding net 223 will have a timing parameter associated therewith, which indicates that net 223 is untimed. Therefore, in any case in which PD 204 is to be modified, it is known that any net that corresponds to net 222 will have an untimed timing parameter associated therewith.

Assigning a timing parameter to untimed nets in the RTL in accordance with an aspect of the present invention method automatically and accurately correlates untimed nets between the RTL and PD. Contrary to conventional design methods, in accordance with an aspect of the present invention, a net in the PD that corresponds to an untimed net in the RTL will not be incorrectly labeled as a timed net, even if the PD is modified. In conventional systems, such a net in the PD may incorrectly be labeled as a timed net because of the conventional manual nature of correlating the named nets.

In an example embodiment, an RTL may be written in a HDL, a non-limiting example of which includes the VHSIC HDL (VHDL). VHDL contains an "attribute" shell that can be applied to annotate parts of a circuit design. Using this construct, the attribute can then be used to specifically influence the processing of the circuit design. The attribute may be assigned to nets disposed in between macros or to the input of a macro that is connected to such a net. For example, if an attribute type named "TIMING_TYPE" were defined, one of its values could be "UNTIMED." Returning to FIG. 3, if an element such as net 323 in FIG. 3 were named NET1_DC using VHDL, net 323 could be attributed with:

ATTRIBUTE TIMING_TYPE OF NET1_DC: SIGNAL IS UNTIMED.

This attribute would indicate to the STA that all transitions through net 323 would receive a phase rename causing its value to be don't-care. This effectively causes net 323 into macros 304 and 306 to be untimed. On the other hand, taking the earlier example of using macro 404 in FIG. 4 to be instead used for testing purposes only, an attribute could be placed on input 331 of macro 304 of FIG. 3 if input 331 were named pin "A" as follows:

ATTRIBUTE TIMING_TYPE OF A: SIGNAL IS UNTIMED.

Figure 4:
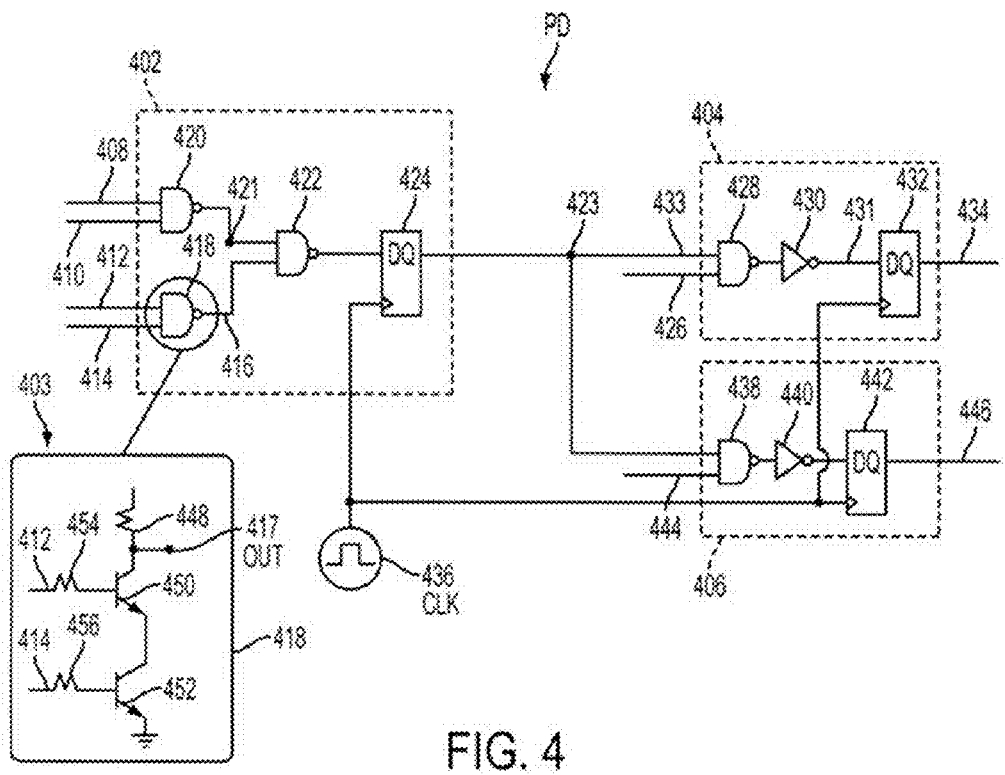
FIG. 4 illustrates a more detailed example of a circuit design within a PD that has been synthesized from the RTL in FIG. 3.
Figure 5:
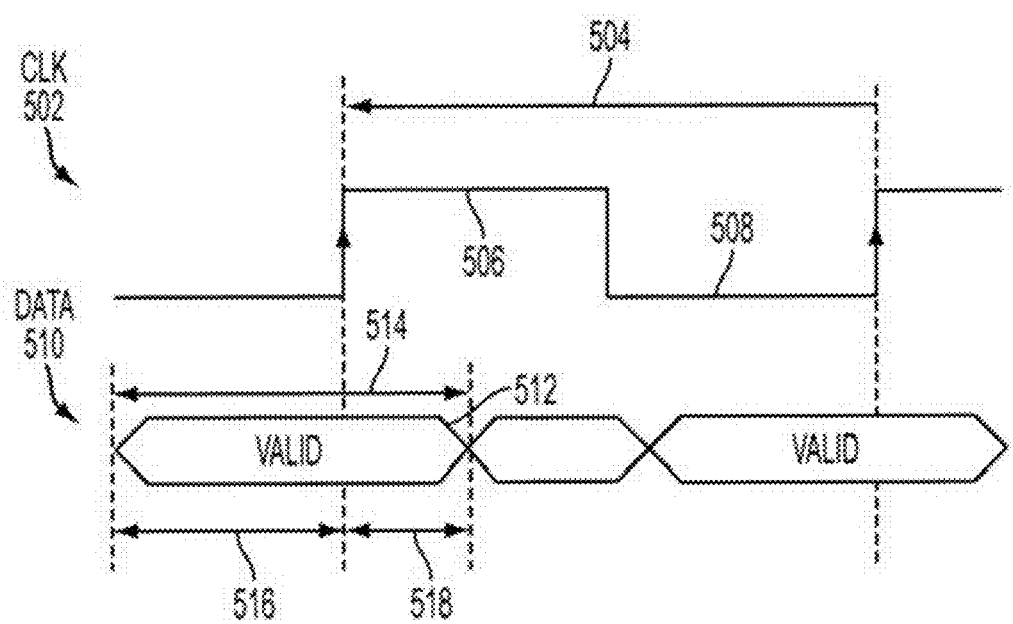
FIG. 5 illustrates a wave diagram of set-up and hold times inherent in a latch.

In accordance with an aspect of the present invention, the attribute associated with input 331 would map to input 433 in FIG. 4 of PD 400, causing input 433 to be untimed.

An advantage of attributing in a timing parameter to untimed nets in the RTL is that any human error in syntax will be caught upon compilation of the RTL. Other advantages also stem from the general efficiencies of programming. For example, if a particular macro is needed multiple times, a simple macro iterative copy will carry any timing parameter attributes such that each copy will be untimed. Further, any macro having an untimed timing parameter associated therewith will maintain the untimed timing parameter independent of renaming of the macro or its instances.

Not every untimed net specified in the RTL may have a timing parameter associated therewith, in accordance with one aspect of the present invention. Because of synthesis, nets inside a given macro in the PD may not directly correspond to nets within a corresponding macro in the RTL. Therefore, in accordance with another aspect of the present invention, untimed nets that exist outside a macro in the RTL may be attributed with a timing parameter. For example, as discussed above, timing parameters may be associated with untimed nets in the RTL, which carry over to the PD. However, there may be situations where further design is performed at the PD. All untimed specification may be done in the RTL. If a net within a macro has no corresponding net in the PD, then the attribute would not get carried over to PD, and the net would be timed in the normal manner, likely resulting in a setup time failure. Such a setup time failure provides feedback to the designer that the untimed net specification failed to work due to changes by synthesis. Such a failure can be rectified by moving the attribute to a different net for which there is a PD counterpart, or by instructing synthesis to preserve the original net (e.g., apply a "no modification" attribute to the net).

In general, in accordance with an aspect of the present invention, timing parameters may be attributed to untimed nets in the RTL at the input and output of macros, at nets which are outside (e.g, run between) macros, and at nets inside macros, which have corresponding nets in the PD.

In accordance with another aspect of the present invention, timing parameters may be attributed to untimed nets in the RTL within macros. Specifically, nets within a given macro at the RTL may have timing parameters attributed thereto if such nets are directly connected to latches. Because of the verification process, where each latch in the RTL must be verified against its corresponding latch in the PD, all latches correspond through synthesis and do not change in design. Therefore, in accordance with this aspect of the present invention, a timing attribute may also be placed on any untimed net directly connected to a latch in the RTL, such as net 327 in FIG. 3 for example.

Because timing parameters may be attributed in the RTL, in accordance with aspects of the present invention, identification of untimed nets for driving onto them indeterminate values may be performed using a hierarchical RTL netlist, as opposed to the physical netlist of the PD referred to by a DCADJ file. Therefore, in accordance with the present invention, there is no longer any need to match physical net names with those named in the RTL. This allows much more freedom for change and redesign without need for respecification of untimed nets. Also, there is no danger that some nets, which are untimed by STA, would fail to be verified due to lack of mapping at the RTL. An example of driving values to untimed nets is described in published U.S. patent application having publication number US 2008/0016480, the entire disclosure of which is incorporated herein by reference.

The above discussed embodiments and aspects of the present invention discuss attributing timing parameters to untimed nets. In accordance with other embodiments and aspects of the present invention, timing parameters may additionally be attributed to nets that are not untimed, but timed at a slower period than the driving clock cycle. In an example embodiment, using a DCADJ file, such a change may include an adjustment in the DCADJ file in addition to the change in the original design. By attributing a timing parameter to a net in the RTL, the net could be annotated as a "slow net" thus signifying the STA should automatically adjust the net's arrival time by a designated amount and the simulation of the RTL should drive the indeterminate value for the designated duration.

Example aspects and embodiments in accordance with the present invention as discussed above are drawn to a method of modeling an integrated circuit design. Other aspects and embodiments in accordance with the present invention, may be similar in purpose and function, but drawn to somewhat different subject matter as discussed below.

Additional example aspects and embodiments in accordance with the present invention are drawn to a device operable to model an integrated circuit design. Non-limiting examples of such a device include a computer having a data input portion, a user interface and a data processing portion. For example, referring to FIG. 1, an embodiment of the present invention may include a system wherein the data processing portion includes a register transfer level design portion, a synthesis portion and a physical design portion. The register transfer level design portion may be operable to create a register transfer level design of the integrated circuit. The physical design portion may be able to create a physical design of the integrated circuit. The synthesis portion may be able to convert the transfer level design into data for use by the physical design portion. Further, an example system in accordance with the present invention may include a Boolean verification portion operable to perform a Boolean verification between the register transfer level design of the integrated circuit and the physical design of the integrated circuit. Still further, an example system in accordance with the present invention may include a static timing analysis portion operable to perform static analysis on the register transfer level design of the integrated circuit.

In some embodiments of the present invention, the system includes a separate device for at least one of the register transfer level design portion, the synthesis portion and the physical design portion. In some embodiments of the present invention, the system includes a single device for the register transfer level design portion, the synthesis portion and the physical design portion. Similarly, in some embodiments of the present invention, the system includes a separate device for at least one of the register transfer level design portion, the synthesis portion, the physical design portion, the Boolean verification portion and the static timing analysis portion. In some embodiments of the present invention, the system includes a single device for the register transfer level design portion, the synthesis portion, the physical design portion, the Boolean verification portion and the static timing analysis portion.

Additional example aspects and embodiments in accordance with the present invention are drawn to a data processing system program product for executing instructions in a data processing system, wherein the data processing system program product includes a data processing system-readable storage medium having data processing system-readable program code embodied in the medium, and wherein the data processing system-readable program code is operable to instruct the data processing system to perform a method of modeling an integrated circuit design. For example, referring to FIG. 1, an embodiment of the present invention may include a data processing system having a media therein wherein the media has program code operable to instruct the data processing portion to create a register transfer level design of the integrated circuit and create a physical design of the integrated circuit. Further, an example system in accordance with the present invention may include program code operable to instruct the data processing portion to perform a Boolean verification between the register transfer level design of the integrated circuit and the physical design of the integrated circuit. Still further, an example system in accordance with the present invention may include program code operable to instruct the data processing portion to perform static analysis on the register transfer level design of the integrated circuit.

There is also interest in verifying that attributed untimed nets do not actually toggle in certain modes of operation. With designation held in the RTL, it becomes easily possible to develop a checker program within the RTL to check that a signal does not transition in such a net.

Further creating the closed-loop process is the before mentioned ability to correlate latch points. If an error caused by the STA over-applying phase renames due to a programming error, some paths might go untimed that should be timed. Because the latch points correlate, a latch for which a setup and hold test is not performed due to a phase rename as reported by the STA could be mapped back to the RTL latch name. This list of names could then be verified against the list of latch names that can receive indeterminate values resulting from untimed nets as can be determined from verification of the RTL. A discrepancy could indicate inconsistencies in interpretation of untimed specifications between the STA and verification processes, thus, closing the loop between the two processes.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed as new and desired to be protected by Letters Patent of the United States is:

1. A method of modeling an integrated circuit design, an integrated circuit having the integrated circuit design being operable to perform intended functions, the method comprising:

creating a register transfer level design of the integrated circuit, the register transfer level design including an untimed net, wherein the register transfer level design further includes a functional macro connected to the untimed net;

associating a timing parameter to the untimed net; and creating a physical design of the integrated circuit based on the register transfer level design, wherein the register transfer level design includes a physical component and the untimed net, and wherein the physical component corresponds to the functional macro and is connected to the untimed net.

2. The method of claim 1, further comprising:

associating a second timing parameter, wherein in creating the register transfer level design of the integrated circuit the register transfer level design further includes a timed net, and wherein in associating the second timing parameter comprises associating a second timing parameter to the timed net.

3. The method of claim 1, wherein in creating the physical design of the integrated circuit based on the register transfer level design, the timing parameter remains associated to the untimed net.

4. The method of claim 1, further comprising:

performing a verification of the register transfer level design of the integrated circuit using the timing parameter to verify that the integrated circuit is operable to perform the intended functions.

5. The method of claim 1, further comprising:

performing static timing analysis on the physical design of the integrated circuit.

6. A system for modeling an integrated circuit design, an integrated circuit having the integrated circuit design being operable to perform intended functions, the system comprising:

a register transfer level design portion operable to create a register transfer level design of the integrated circuit such that the register transfer level design includes an untimed net, wherein the register transfer level design further includes a functional macro connected to the untimed net;

a timing parameter portion operable to associate a timing parameter to the untimed net; and a physical design portion operable to create a physical design of the integrated circuit based on the register transfer level design, wherein the register transfer level design includes a physical component and the untimed net, and wherein the physical component corresponds to the functional macro and is connected to the untimed net.

7. The system of claim 6, wherein the timing parameter portion is further operable to associate a second timing parameter, wherein the register transfer level design portion is further operable to create the register transfer level design of the integrated circuit such that the register transfer level design further includes a timed net, and wherein the timing parameter portion is operable to associate the second timing parameter to the timed net.

8. The system of claim 6, wherein the physical design portion is further operable to create the physical design of the integrated circuit based on the register transfer level design such that the timing parameter remains associated to the untimed net.

9. The system of claim 6, further comprising:
a verification portion operable to perform a verification of the register transfer level design of the integrated circuit using the timing parameter to verify that the integrated circuit is operable to perform the intended functions.

10. The system of claim 6, further comprising:
a static timing analysis portion operable to perform static timing analysis on the physical design of the integrated circuit.

11. A data processing system program product for executing instructions in a data processing system, the data processing system program product comprising a data processing system-readable storage medium having data processing system-readable program code embodied in the medium, the data processing system-readable program code being operable to instruct the data processing system to perform a method of modeling an integrated circuit design, an integrated circuit having the integrated circuit design being operable to perform intended functions, the method comprising:
creating a register transfer level design of the integrated circuit, the register transfer level design including an untimed net, wherein the register transfer level design further includes a functional macro connected to the untimed net;
associating a timing parameter to the untimed net; and
creating a physical design of the integrated circuit based on the register transfer level design, wherein the register transfer level design includes a physical component and the untimed net, and wherein the physical component corresponds to the functional macro and is connected to the untimed net.

12. The data processing system program product of claim 11, wherein the data processing system-readable program code is further operable to instruct the data processing system to perform a method further comprising:
associating a second timing parameter, wherein in creating the register transfer level design of the integrated circuit the register transfer level design further includes a timed net, and wherein in associating the second timing parameter comprises associating a second timing parameter to the timed net.

13. The data processing system program product of claim 11, wherein in creating the physical design of the integrated circuit based on the register transfer level design, the timing parameter remains associated to the untimed net.

14. The data processing system program product of claim 11, wherein the data processing system-readable program code is further operable to instruct the data processing system to:
perform a verification of the register transfer level design of the integrated circuit using the timing parameter to verify that the integrated circuit is operable to perform the intended functions.

15. The data processing system program product of claim 11, wherein the data processing system-readable program code is further operable to instruct the data processing system to:
perform static timing analysis on the physical design of the integrated circuit.

* * * * *